(12) United States Patent
Eldridge

(10) Patent No.: US 6,468,098 B1
(45) Date of Patent: Oct. 22, 2002

(54) ELECTRICAL CONTACTOR ESPECIALLY WAFER LEVEL CONTACTOR USING FLUID PRESSURE

(75) Inventor: Benjamin N. Eldridge, Danville, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 09/376,759

(22) Filed: Aug. 17, 1999

(51) Int. Cl.⁷ .................................................. H01R 4/60
(52) U.S. Cl. ...................................................... 439/197
(58) Field of Search ........................... 439/197; 324/754

(56) References Cited

U.S. PATENT DOCUMENTS

| | | |
|---|---|---|
| 4,523,144 A | 6/1985 | Okubo et al. |
| 4,636,722 A | 1/1987 | Ardezzone |
| 4,780,670 A | 10/1988 | Cherry |
| 4,820,976 A | 4/1989 | Brown ........................ 324/158 |
| 4,899,099 A | 2/1990 | Mendenhall et al. |
| 4,968,931 A | 11/1990 | Littlebury et al. .......... 324/158 |
| 4,994,735 A | 2/1991 | Leedy |
| 5,020,219 A | 6/1991 | Leedy .......................... 29/846 |
| 5,055,778 A | 10/1991 | Okubo et al. |
| 5,090,118 A | 2/1992 | Kwon et al. |
| 5,102,343 A * | 4/1992 | Knight et al. ................. 439/67 |
| 5,172,050 A | 12/1992 | Swapp |
| 5,323,107 A | 6/1994 | D'Souza |

(List continued on next page.)

FOREIGN PATENT DOCUMENTS

| | | | |
|---|---|---|---|
| EP | 0463684 A1 * | 1/1992 | |
| GB | 1349786 * | 4/1974 | |
| JP | 62142279 | 6/1987 | ........... G01R/31/02 |
| JP | 3-065659 | 3/1991 | |
| JP | 4-207047 | 7/1992 | |
| JP | 5-029406 | 2/1993 | |
| JP | 8-015318 | 1/1996 | |

OTHER PUBLICATIONS

"High Density Probe Assembly," 2244 Research Disclosure No. 333 (Emsworth, Great Britain Jan. 1992).

*Primary Examiner*—Tulsidas Patel
*Assistant Examiner*—Phuong Dinh
(74) *Attorney, Agent, or Firm*—N. Kenneth Burraston; Stuart L. Merkadeau

(57) ABSTRACT

An electrical interconnect assembly and methods for making an electrical interconnect assembly. In one embodiment, an interconnect assembly includes a flexible wiring layer having a plurality of first contact elements and a fluid containing structure which is coupled to the flexible wiring layer. The fluid, when contained in the fluid containing structure, presses the flexible wiring layer towards a device under test to form electrical interconnections between the first contact elements and corresponding second contact elements on the device under test. In a further embodiment, an interconnect assembly includes a flexible wiring layer having a plurality of first contact terminals and a semiconductor substrate which includes a plurality of second contact terminals. A plurality of freestanding, resilient contact elements, in one embodiment, are mechanically coupled to one of the flexible wiring layers or the semiconductor substrate and make electrical contacts between corresponding ones of the first contact terminals and the second contact terminals. In another embodiment, a method of making electrical interconnections includes joining a flexible wiring layer and a substrate together in proximity and causing a pressure differential between a first side and a second side of the flexible wiring layer. The pressure differential deforms the flexible wiring layer and causes a plurality of first contact terminals on the flexible wiring layer to electrically connect with a corresponding plurality of second contact terminals on the substrate.

48 Claims, 7 Drawing Sheets

U.S. PATENT DOCUMENTS

| | | |
|---|---|---|
| 5,395,253 A | 3/1995 | Crumly |
| 5,399,982 A | 3/1995 | Driller et al. |
| 5,534,784 A | 7/1996 | Lum et al. |
| 5,550,482 A | 8/1996 | Sano ......................... 324/758 |
| 5,686,842 A | 11/1997 | Lee |
| 5,773,986 A * | 6/1998 | Thompson et al. ......... 324/754 |
| 5,806,181 A | 9/1998 | Khandros et al. |
| 5,828,226 A | 10/1998 | Higgins et al. |
| 5,917,707 A | 6/1999 | Khandros et al. |
| 5,974,662 A | 11/1999 | Eldridge et al. |
| 5,998,228 A * | 12/1999 | Eldridge et al. ............ 324/754 |
| 6,064,213 A | 3/2000 | Khandros et al. |
| 6,351,134 B2 | 2/2002 | Leas et al. |
| 2001/0012704 A1 | 8/2001 | Eldridge |
| 2001/0054905 A1 | 12/2001 | Khandros et al. |

\* cited by examiner

US 6,468,098 B1

ELECTRICAL CONTACTOR ESPECIALLY WAFER LEVEL CONTACTOR USING FLUID PRESSURE

FIELD OF THE INVENTION

The present invention relates to interconnect assemblies and methods for making and using interconnections and more particularly to interconnect assemblies for making electrical contact with contact elements on a substrate such as a semiconductor integrated circuit. More particularly, the present invention relates to methods and assemblies for making interconnections to semiconductor devices to enable test and/or burn-in procedures on the semiconductor devices.

BACKGROUND OF THE INVENTION

There are numerous interconnect assemblies and methods for making and using these assemblies in the prior art. For example, it is usually desirable to test the plurality of dies (integrated circuits) on a semiconductor wafer to determine which dies are good prior to packaging them and preferably prior to being singulated from the wafer. To this end, a wafer tester or prober may be advantageously employed to make a plurality of discreet pressure connections to a like plurality of discreet contact elements (e.g. bonding pads) on the dies. In this manner, the semiconductor dies can be tested prior to singulating the dies from the wafer. The testing is designed to determine whether the dies are non-functional ("bad"). A conventional component of a wafer tester or prober is a probe card to which a plurality of probe elements are connected. The tips of the probe elements or contact elements make the pressure connections to the respective bonding pads of the semiconductor dies in order to make an electrical connection between circuits within the dies and a tester such as an automated test equipment (ATE). Conventional probe cards often include some mechanism to guarantee adequate electrical contact for all contact elements at the bonding pads of the die regardless of the length of the contact elements or any variation in height between the two planes represented by the surface of the die and the tips of the probe pins or contact elements on the probe card. An example of a probe card having such a mechanism can be found in probe cards from FormFactor of Livermore, Calif. (also see the description of such cards in PCT International Publication No. WO 96/38858).

One type of interconnect assembly in the prior art uses a resilient contact element, such as a spring, to form either a temporary or a permanent connection to a contact pad on a semiconductor integrated circuit. Examples of such resilient contact elements are described in U.S. Pat. No. 5,476,211 and also in co-pending, commonly-assigned U.S. Patent Application entitled "Lithographically Defined Microelectronic Contact Structures," Ser. No. 09/032,473, filed Feb. 26, 1998, and also co-pending, commonly-assigned U.S. Patent Application entitled "Interconnect Assemblies and Methods," Ser. No. 09/114,586, filed Jul. 13, 1998. These interconnect assemblies use resilient contact elements which can resiliently flex from a first position to a second position in which the resilient contact element is applying a force against another contact terminal. The force tends to assure a good electrical contact, and thus the resilient contact element tends to provide good electrical contact.

These resilient contact elements are typically elongate metal structures which in one embodiment are formed according to a process described in U.S. Pat. No. 5,476,211. In another embodiment, they are formed lithographically (e.g. in the manner described in the above-noted patent application entitled "Lithographically Defined Microelectronic Contact Structures"). In general, resilient contact elements are useful on any number of substrates such as semiconductor integrated circuits, probe cards, interposers, and other electrical assemblies. For example, the base of a resilient contact element may be mounted to a contact terminal on an integrated circuit or it may be mounted onto a contact terminal of an interposer substrate or onto a probe card substrate or other substrates having electrical contact terminals or pads. The free end of each resilient contact element can be positioned against a contact pad on another substrate to make an electrical contact through a pressure connection when the one substrate having the resilient contact element is pressed towards and against the other substrate having a contact element which contacts the free end of the resilient contact element. Furthermore, a stop structure, as described in the above noted application Ser. No. 09/114,586, may be used with these resilient contact elements to define a minimum separation between the two substrates.

FIG. 1 shows one technique for the use of an interconnect assembly. This interconnect 101 includes a chuck structure 117 disposed above a semiconductor wafer 111, which wafer is supported by a bellows structure 103. The chuck structure is rigid (not deformable), and the surface of the chuck 117 which includes the contact elements 125 and 127 is also rigid. The bellows structure 103 includes an expandable bellows 105 and intake and outtake ports 107A and 107B. In one use of this bellows structure, a fluid, such as water 106 is passed into and out of the bellows structure 103. A thin steel membrane 109 is welded or otherwise attached to the bellows 105. The thin membrane may be used to exert uniform pressure against the back of wafer 111 to press the top surface of the wafer against the stop structures 121 and 123, thereby causing electrical connections between the springs (or other resilient contact elements) on the wafer and the contact elements on substrate 117. This uniform pressure may overcome some variations in flatness between the meeting surfaces, such as the top surface of the wafer 111 and the surface supporting the stop structures 121 and contact elements 125 and 127. This thin steel membrane 109 also allows for the transfer of heat to or from the semiconductor wafer 111 which is disposed on top of the membrane 109. The fluid such as water 106, may be introduced into the bellows structure under pressure to force the membrane 109 into direct contact with the backside of the wafer 111.

This fluid may be heated or cooled in order to control or affect the temperature of the wafer. For example, in a burn-in test of an integrated circuit (or wafer containing integrated circuits), the fluid may be heated to raise the temperature of the wafer and then cooled, and this process may be repeated over several cycles. The chuck 117 includes stop structures 121 and 123 which are proximally adjacent to contact elements 125 and 127 respectively. It may be desirable to place a thermal transfer layer between the membrane 109 and the back of the wafer 111 to improve the heat transfer efficiency between the fluid and the wafer 111. The contact elements 125 and 127 are designed to make contact with the resilient contact elements 115 and 113 on the wafer 111. It will be appreciated that there will typically be many more resilient contact elements and many more contact elements than those shown in FIG. 1. The chuck 117 includes wiring or other interconnection in order to connect resilient contact elements 115 and 113, through contact elements 125 and 127, to a tester allowing communication of power, signals, and the like between the tester and the semiconductor wafer. The chuck 117 may be held in place by a post 118 in order to allow the wafer 111 to be pressed against the chuck 117 by the expanding of the bellows 105; alternatively, the chuck 117 may be pressed and held by a clamshell support which contacts and covers the top of the chuck 117 with a backing plate and may also surround the sides and bottom of the bellows 105.

FIG. 2 shows another example of an interconnect assembly 201. In this case, a rigid chuck 203 supports a wafer of semiconductor devices 204. The wafer includes a plurality of contact elements, such as the contact element 210A which are designed and disposed to make contact relative to resilient contact elements on the wiring substrate 206. The resilient contact elements 207, 209, and 210 are another example of a resilient element; in this case, they have a generally straight cantilever structure. The stop structures 214, 216, and 218 are attached to a rigid wiring substrate 206 and are designed to define the z separation between the wiring substrate 206 and the wafer 204. A vacuum port 212 in the wiring substrate 206 allows a vacuum to be formed between the space between the wiring substrate 206 and the chuck 203. The O-ring seal 205 ensures that a vacuum is formed between the wiring substrate 206 and the chuck 203. When the vacuum is formed, the wiring substrate 206 is pressed down towards the wafer 204 in order to cause contact to be made between the various resilient contact elements and their corresponding contact elements on the wafer 204.

FIG. 3 shows another example of an interconnect assembly 351 according to the present invention. In this case, a pressure bladder 355 forces the rigid wiring substrate 354 in contact with the wafer 353. A clamp 355A is used to press the bladder into the rigid substrate 354. The wafer 353 sits on top of a rigid chuck 352 and includes a plurality of contact elements, such as the contact element 357A shown in FIG. 3. As the bladder 355 forces the rigid wiring substrate 354 into contact with the wafer 353, the stop structures 358, 359, and 360 are brought into contact with the top surface of the wafer 353. This contact defines a separation between the rigid wiring substrate 354 and the semiconductor wafer 353. When this contact occurs, the resilient contact elements 357 are brought into mechanical and electrical contact with their corresponding contact elements on the wafer 353.

FIG. 4A shows an example of a flexible probe card device 401. This probe card device includes a flexible or deformable substrate 402 having contact elements 403, 404, and 405 disposed on one side and a plurality of electrical conductive traces which creates a wiring layer on the opposite side of the flexible substrate 402. An insulator (not shown) typically covers most of the wiring layer. The contact element 403 is electrically coupled through the via 403A to the trace 403B. Similarly, the contact element 404 is electrically coupled through the via 404A to the trace 404B on the opposite side of the flexible substrate 402. Typically, the contact elements 403, 404, and 405 are formed to have approximately the same height and they may be formed by a number of techniques to create a ball grid array or other arrangements of contactors. FIG. 4B shows an example of the use of a flexible probe card device in order to probe or test a semiconductor wafer 430. In particular, the flexible probe device 420, which resembles the device 401, is pressed into contact, by a force F, with the wafer 430. Each of the respective contact elements on the flexible probe device 420, such as the contact element 424, makes a contact with a respective contact element, such as element 434, on the wafer 430 in order to perform the probe test. The flexible probe device 420 is pressed into contact-by use of a press 410 which creates the force F.

The press 410 has a rigid, flat surface and it presses the flexible probing substrate rigidly along the entire surface of the probing substrate 420. Referring back to FIG. 4A, the press 410 presses against the surface of the substrate 402 which is opposite the contact elements 403, 404, and 405. It will be appreciated that an insulating layer may separate the press 410 from the wiring layers 403B, 404B and 405B. If one or more of the contact elements 403, 404, and 405 is smaller (e.g. shorter, etc.) than other contact elements, then it is possible for the smaller contact elements to not make contact when the flexible probing substrate is pressed into contact with a wafer. This is due to the fact that the rigid surface of the press 410 will press the contact elements into contact with a corresponding contact elements on the wafer up to the point when the largest contact elements on the flexible probing substrate have made contact with respective contact elements on the wafer. Thus, the smaller contact elements may not make contact.

FIG. 4C shows an example of how irregularities in contact elements and/or irregularities in the surfaces supporting the contact elements can cause a failure to make electrical connection. A force from a rigid press 410 causes the contact elements 424A and 424C to make contact (both mechanically and electrically). Contact elements 424A and 424C have been formed normally according to a desired size, but contact element 424B is smaller (e.g. shorter) than the desired size. This difference in size may even be within manufacturing tolerances but nevertheless is relatively shorter than its neighbors. The mechanical contact of contact elements 424A and 424C with their corresponding contact elements 434A and 434C stops the movement between the layer 420 and the IC 430, and it becomes impossible to create an electrical contact between contact element 424B and its corresponding contact element 434B.

Similar problems exist with the assemblies shown in FIGS. 1, 2, and 3. In the case of the assemblies of FIGS. 1, 2, and 3, the wiring substrate is rigid in all three cases and thus any local differential in heights of the various contact elements (or other irregularities in the two opposing surfaces) may result in a lack of contact being made. Such other irregularities may include a difference in adequate flatness between the two surfaces. The requirement to control the flatness of the two surfaces also increases the manufacturing expense for the surfaces. Furthermore, it is often difficult to achieve and maintain parallelism between the two surfaces, particularly when incorporating the need for precise x, y positional alignment control which may restrict the ability to allow for a compensating tilt. Accordingly, it is desirable to provide an improved assembly and method for making electrical interconnections and particularly in performing wafer probing and/or burn-in testing of semiconductor devices.

SUMMARY OF THE INVENTION

The present invention provides an interconnect assembly and methods for making and using the assembly. In one example of the present invention, an interconnect assembly includes a flexible wiring layer having a plurality of first contact elements and a fluid containing structure which is coupled to the flexible wiring layer. The fluid, when contained in the fluid containing structure, presses the flexible wiring layer towards a device under test to form electrical interconnections between the first contact elements and corresponding second contact elements on the device under test, which may be in one embodiment a single integrated circuit or several integrated circuits on a semiconductor wafer.

In another example of the present invention, an interconnect assembly includes a flexible wiring layer having a plurality of first contact terminals and a semiconductor substrate which includes a plurality of second contact terminals. A plurality of freestanding, resilient contact elements are mechanically coupled to one of the flexible wiring layer or the semiconductor substrate and make electrical contacts between corresponding ones of the first contact terminals and the second contact terminals.

In another exemplary embodiment of the present invention, a method of making electrical interconnections includes joining a flexible wiring layer and a substrate together in proximity and causing a pressure differential between a first side and a second side of the flexible wiring layer. The pressure differential deforms the flexible wiring layer and causes a plurality of first contact terminals on the flexible wiring layer to electrically contact with a corresponding plurality of second contact terminals on the substrate.

In a preferred embodiment, a plurality of travel stop elements may be distributed on one or both of the flexible wiring layer and the substrate.

It will be appreciated that the various aspects of the present invention may be used to make electrical connection between a single pair of contact elements on two separate substrates or may make a plurality of electrical connections between a corresponding plurality of pairs of contact elements on two different substrates. Various other assemblies and methods are described below in conjunction with the following figures.

BRIEF DESCRIPTION OF THE DRAWINGS

The present invention is illustrated by way of example and not limitation in the figures of the accompanying drawings in which like references indicate similar elements. It is also noted that, the drawings are not necessarily drawn to scale.

DETAILED DESCRIPTION

The present invention relates to interconnection assemblies and methods for making interconnections and particularly to interconnect assemblies and methods for making mechanical and electrical connection to contact elements on an integrated circuit. The following description and drawings are illustrative of the invention and are not to be construed as limiting the invention. Numerous specific details are described to provide a thorough understanding of the present invention. However, in other instances, well known or conventional details are not described in order to not unnecessarily obscure the present invention in detail.

Figure 1:
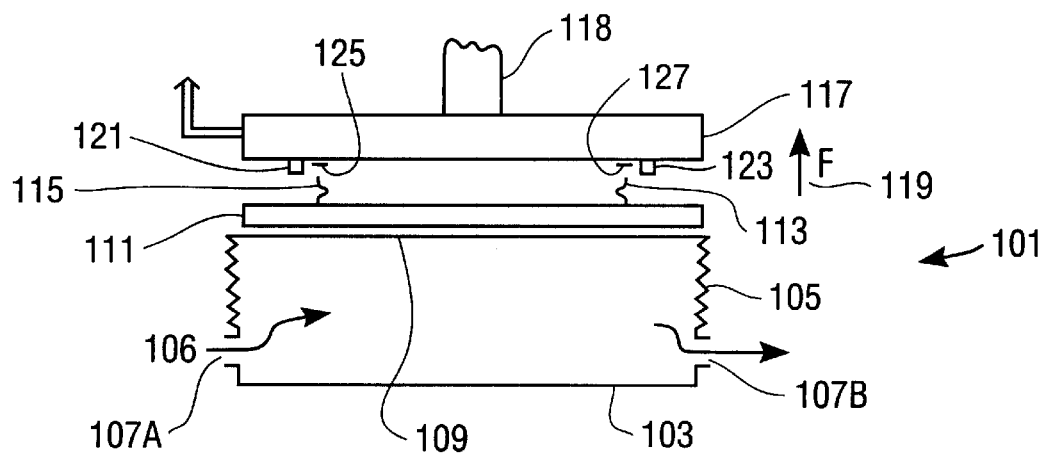
FIG. 1 shows an example of an interconnect assembly which uses a bellows to force a semiconductor wafer into contact with a rigid wiring substrate.
Figure 2:
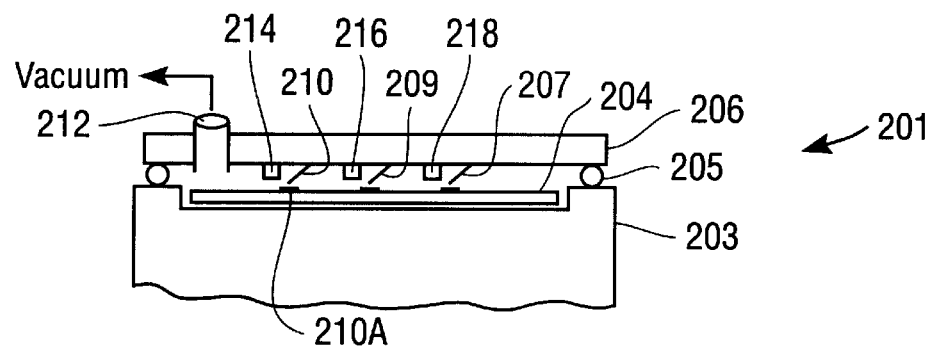
FIG. 2 shows another example of an assembly for creating an electrical interconnection between one substrate, such as a semiconductor wafer, and a rigid wiring substrate through the use of a vacuum.
Figure 3:
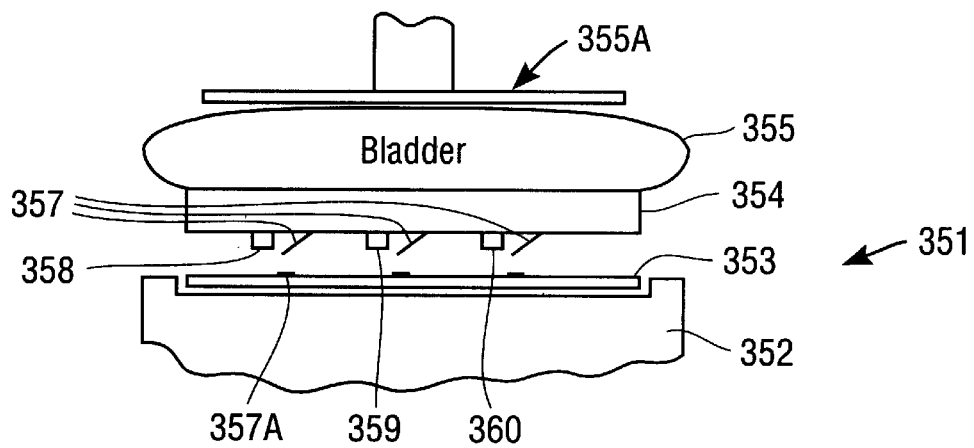
FIG. 3 shows another example of an assembly for creating an electrical interconnection between one substrate, such as a semiconductor wafer, and a wiring substrate.
Figure 4A:
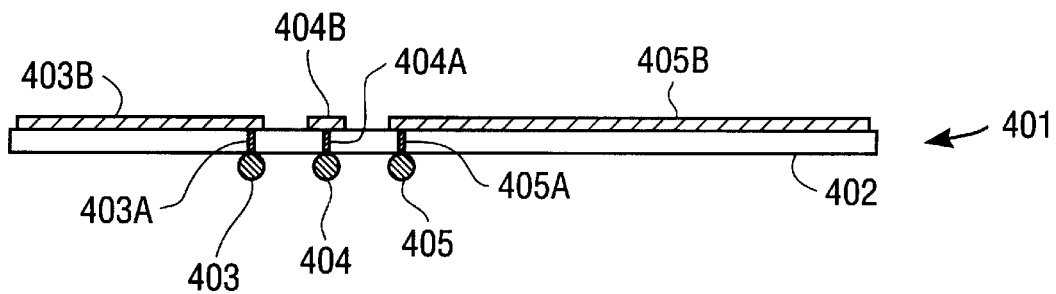
FIG. 4A shows an example of a flexible probing device which may be used to probe a semiconductor wafer in a probing operation.
Figure 4B:
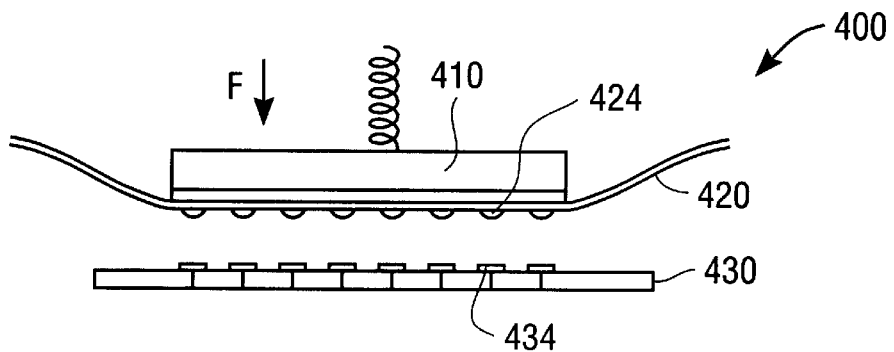
FIG. 4B shows an example of an assembly for using a flexible probing device in order to perform a wafer probing operation.
Figure 5:
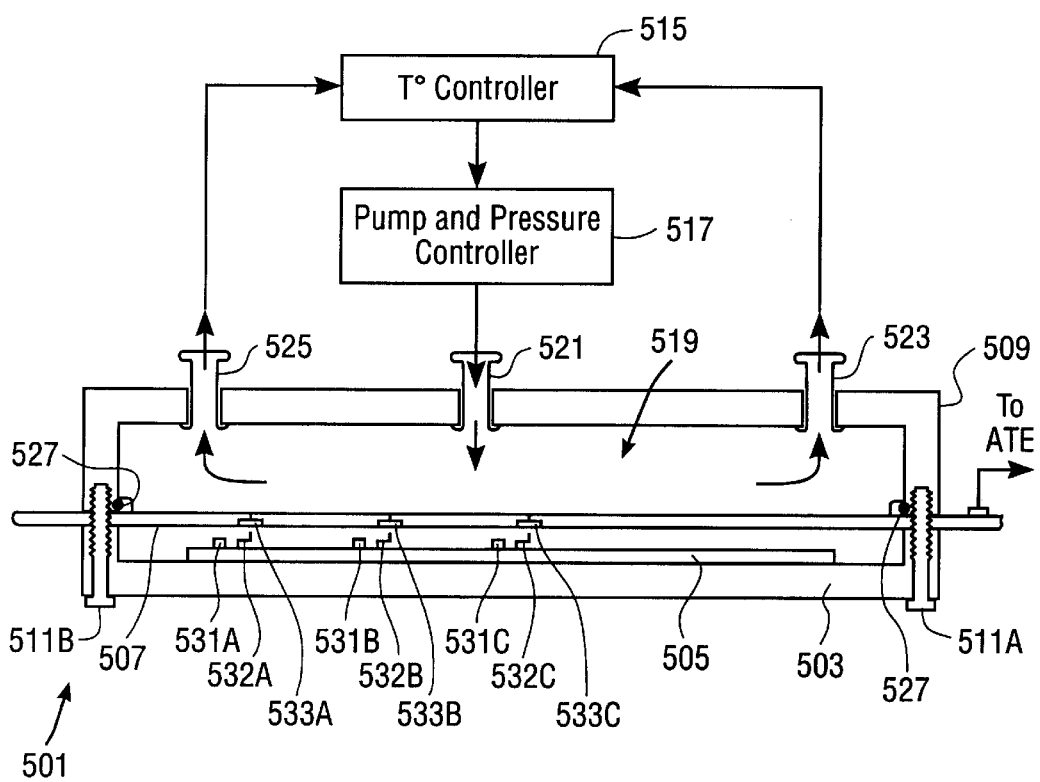
FIG. 5 is a cross-sectional view showing an example of an interconnection assembly-according to one embodiment of the present invention.

FIG. 5 shows one example of an electrical interconnection assembly according to the present invention. The assembly includes a fluid containing structure 509 which includes a chamber 519 for containing the fluid. The fluid is retained by as the inner walls of the structure 509 and by the flexible wiring layer 507 which may, in one embodiment, be similar to the flexible probing device shown in FIG. 4A. Disposed below the flexible wiring layer 507 is a device under test such as the integrated circuit or semiconductor wafer 505. The integrated circuit 505 is supported by a backing plate 503 which may be rigid. The backing plate 503 is secured to the fluid containing structure 509 by bolts 511A and 511B as shown in the cross-sectional view of FIG. 5. An O-ring seal 527 (or other sealing mechanisms which may be used) serves to seal the chamber 519 from leakage of fluid between the flexible wiring layer 507 and the edge of the assembly 509. The O-ring seal 527 is under a foot of the edge of assembly 509 and is pressed into tight contact with the flexible wiring layer 507. Fluid may be introduced into the chamber 519 through the inlet port 521 and fluid may be removed from the chamber 519 through the outlet ports 525 and 523. Fluid which is removed from these outlet ports may be pumped or transferred to a temperature controller 515 which then provides fluid having a desired temperature to a pump and pressure controller 517 which, in turn, returns the fluid through the port 521 back into the chamber 519. It may be desirable to maintain the fluid in a continuously circulating state in order to maintain an accurately controlled temperature and in order to maintain a desired pressure.

FIG. 5 shows the state of the interconnection assembly before introducing a fluid, such as a liquid or a gas, into the chamber 519. In particular, the flexible wiring layer has been placed in proximity, and typically close proximity (e.g. about 75 to about 750 microns), to the contact surface of the integrated circuit 505. Typically, the electrical contact elements on the flexible wiring layer, such as contact elements 533A, 533B and 533C will not be in mechanical contact and will not be in electrical contact with the corresponding contact elements on the integrated circuit, such as the contact elements 532A, 532B and 532C, when the fluid has not been introduced into the chamber 519. After mounting the integrated circuit 505 or other device under test in proximity to the flexible wiring layer 507, then the fluid may be introduced into the chamber 519 to create a pressure differential between one side of the flexible wiring layer 507 and the other side of the flexible wiring layer 507, thereby pressing the flexible wiring layer into contact with the contact elements of the integrated circuit 505. This is shown in the partial view of FIG. 6C which shows a portion of the flexible wiring layer 507 being brought into contact with the contact elements of the integrated circuit 505 which is supported by the backing plate 503 as shown in FIG. 6C. The pressure created by the fluid is represented by the pressure 690 shown in FIG. 6C. Because the flexible wiring layer is deformable, portions in local regions of the flexible wiring layer may slightly deform relative to other regions of the flexible wiring layer under the pressure of the fluid in order to create contact. When the fluid is removed from the chamber 519, the flexible wiring layer 507 may return to its non-deformed state.

This provides a solution for the situation in which the heights of the contact elements differ enough so that using conventional assembly techniques, the smaller height contact elements will not make an electrical connection. This solution also accounts for a lack of parallelism between the two surfaces and for non-planarities in the surfaces.

As shown in FIGS. 5 and 6C, stop structures, such as stop structures 531A, 531B, and 531C may be disposed on the upper surface of the integrated circuit 505 in order to define the minimum separation between the integrated circuit 505 and the local regions of the flexible wiring layer 507. Using the stop structures to define this separation will allow the use of considerable pressure exerted by the fluid in order to ensure adequate electrical contact across the entire surface of the integrated circuit 505 without at the same time damaging the contact elements, such as the resilient, freestanding contact elements 532A, 532B and 532C shown in FIG. 5. FIG. 6C shows the stop structures in action as they prevent the flexible wiring layer 507 from being pressed further towards the surface of the integrated circuit 505 by the fluid pressure 690. In an alternative embodiment, the stop structures may be attached to the surface of the flexible wiring layer, or stop structures may be disposed on both surfaces.

Figure 4C:
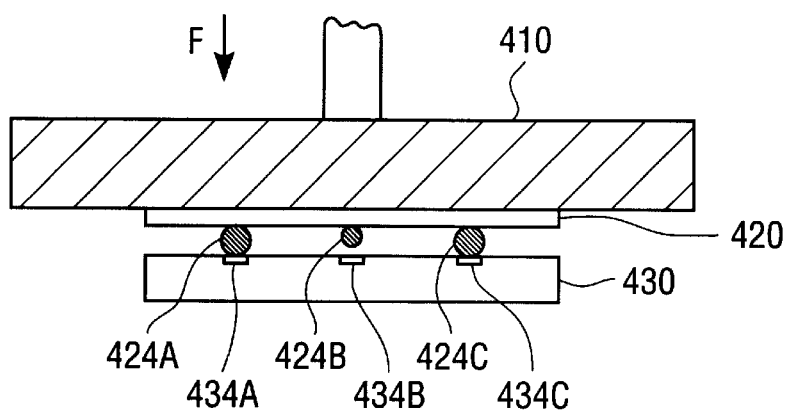
FIG. 4C shows how a failed connection can result from the use of an interconnection assembly of the prior art.
Figure 6A:
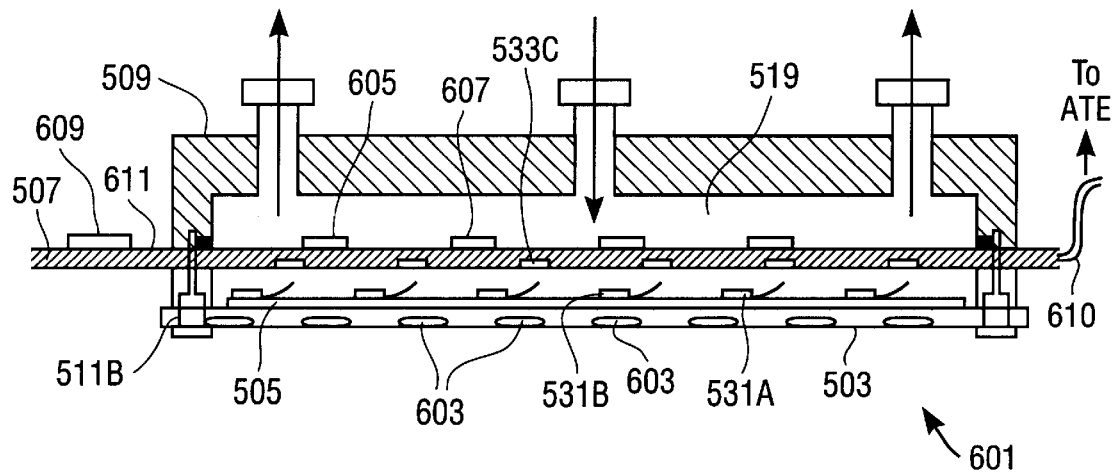
FIG. 6A is a cross-sectional view showing another embodiment of an interconnection assembly according to the present invention.
Figure 6B:
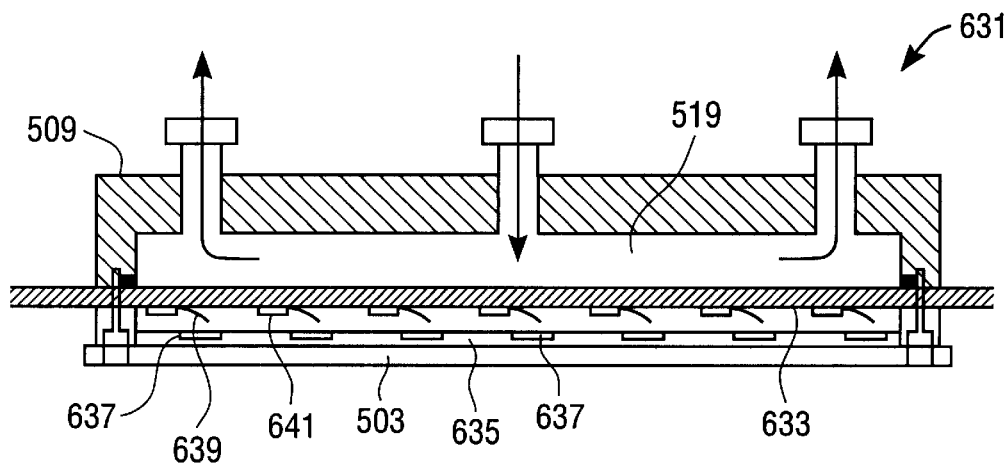
FIG. 6B is a cross-sectional view of another embodiment of an electrical interconnection assembly according to the present invention.
Figure 6C:
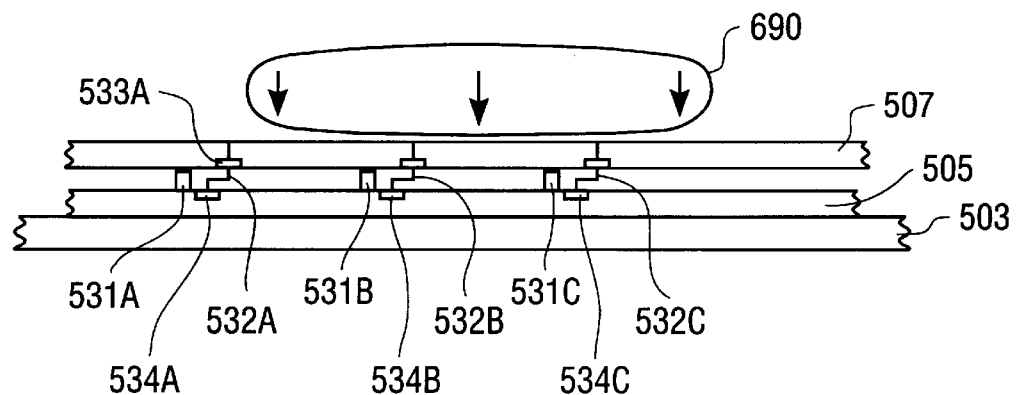
FIG. 6C shows in partial view and in cross-sectional view an example of an electrical interconnection assembly in use according to one embodiment of the present invention.
Figure 6D:
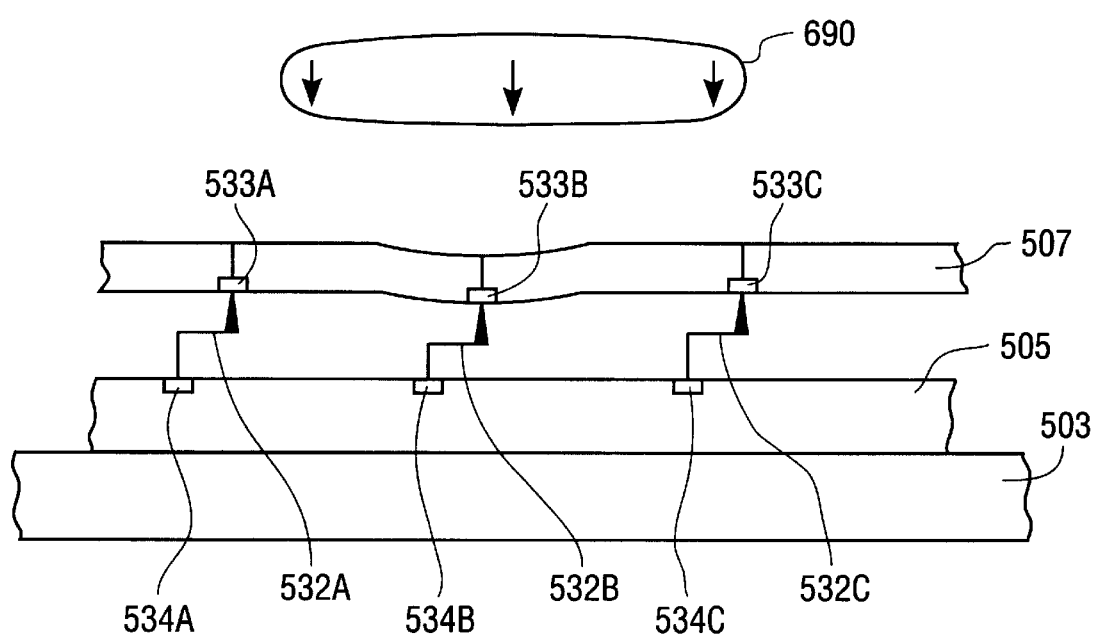
FIG. 6D shows in cross-suctional view how a flexible wiring layer of the present invention can deform in order to provide an electrical connection despite irregularities in surfaces and/or contact elements.

FIG. 6D shows an example of how a flexible wiring layer can deform or flex in a local region in order to provide an electrical connection despite irregularities in surfaces and/or contact elements. The example of FIG. 6D shows the use of resilient contact elements, however, it will be appreciated that in an alternative example, rigid contact elements (e.g. C4 balls) may be used rather than resilient contact elements. The flexible wiring layer 507, under the influence of the fluid pressure 690, deforms locally around the contact element 533B. The deformation stops when the element 533B makes mechanical (and hence electrical) contact with the freestanding, resilient contact element 532B, which is shorter than the freestanding, resilient contact elements 532A and 532C. Without the deformation, electrical connection may not occur between contact elements 534B and 533B (see, for example, FIG. 4C where no deformation occurs since the planar surface of press 410 is rigid). The flexible wiring layer 507 is capable of providing electrical contact between corresponding contact elements even when the surfaces are irregular (e.g. bumpy or uneven) or when they are not exactly parallel or even when the contact elements are irregular (e.g. the heights of the contact elements vary too much). When resilient contact elements are used as the connection elements between the two surfaces, they may accommodate the "local" variations or irregularities in the two surfaces (e.g. over a distance range of up to about 2000 to 5000 microns), such that the flexible wiring layer may not need to be so flexible that it deforms over such a local range, but in this case the flexible wiring layer should still be deformable enough that it can accommodate longer range variations or irregularities (e.g. a lack of parallelism between the two surfaces over a range of several inches across the flexible wiring layer).

The flexible wiring layer 507 may be used with or without stop structures. The stop structures may be desirable when the pressure differential between the two surfaces of the flexible wiring layer is so large that the contact elements could be damaged from the resulting force or when it is desirable to provide a force larger than the minimum to allow for manufacturing tolerances in the flexible wiring layer, chucks, contact elements, etc. The height and placement of the stop structures should be designed to allow for normal flexing of the resilient contact element and to allow for the flexible wiring layer to deform at least beyond a local range. The flexible wiring layer should be flexible, and/or deformable, enough to allow for local deformations. In the case where resilient contact elements are used, the flexible wiring layer should be deformable enough to mold, under pressure, to a substrate's shape (e.g. a wafer's shape) and yet still be stiff enough over a local range to not deform too much between travel stops. The flexible wiring layer should be more flexible in the case where rigid contact elements (e.g. C4 balls as in FIG. 4C) are used between the two surfaces. Furthermore, given that, in most cases, the flexible wiring layer will be used again and again for testing different ICs (or different wafers), the flexible wiring layer should be able to return to its non-deformed shape after the pressure differential is relieved. This is achieved by operating the flexible wiring layer within the elastic deformation regime of the material in the flexible wiring layer.

It will be appreciated that the flexible wiring layer 507 may be formed out of any number of materials, such as a polyimide material which allows for sufficient local flexibility and/or deformability in small areas. Furthermore, the flexible wiring layer may contain multiple wiring layers disposed between layers of insulators as is well-known in the art of creating multiple layer conductive substrates such as printed circuit boards or flexible printed circuit boards. The flexible wiring layer 507 may be used to make electrical connections with a single integrated circuit either before or after packaging of the integrated circuit or may be used to make electrical connections to ione or more of the integrated circuits on a semiconductor wafer or portion of a semiconductor wafer. Furthermore, the flexible wiring layer 507 may be used to make electrical connections to a passive connector assembly such as an interposer or other type of connection substrates which do not include integrated circuits or semiconductor materials. Thus, the flexible wiring layer 507 may be used to test a single integrated circuit or one or more integrated circuits on a semiconductor wafer or on a connection substrate such as an interposer. It will be further understood that the flexible wiring layer 507 in conjunction with the assembly of the present invention may be used with various types of connection elements including, for example, resilient, freestanding connection elements such as those noted above or other types of connection elements such as bonding pads, C4 balls, elastomeric balls, pogo pins, as well as other contact elements which are known in the art and the connection elements may be disposed on one or both of the flexible wiring layer.

In the case of full wafer testing, with wide temperature variations, the material chosen for the flexible wiring layer should have a TCE (thermal coefficient of expansion) close to or identical to the TCE of silicon. This can be achieved by suitable choice of material (e.g. Upilex S or Arlon 85NT) or even further enhanced by adding well-known low expansion layers (such as Invar) to the flexible wiring layer.

FIG. 6A shows another example of an interconnection assembly according to the present invention. This interconnection assembly also includes a chamber 519 which is used to receive and contain a fluid which is used to create a pressure differential across the flexible wiring layer 507. The flexible wiring layer 507 includes contact elements disposed on the side of the flexible wiring layer 507 which faces the integrated circuit 505. These contact elements, such as contact element 533C, are used to make electrical contact with corresponding contact elements on the integrated circuit 505. As in the case of the assembly shown in FIG. 5, when fluid is introduced into the chamber 519, the flexible wiring layer 507 is pressed towards the integrated circuit 505 such that the contact elements on the integrated circuit 505 make electrical contact with the corresponding contact elements on the flexible wiring layer 507 shown in FIG. 6A. As shown in FIG. 6A, the flexible wiring layer 507 includes several active or passive electrical devices such as devices 605, 607, and 609 which are attached to the side of the flexible wiring layer 507 which is not adjacent to the integrated circuit 505. These electrical devices may be integrated circuits which are used to provide signals to or receive signals from the integrated circuit 505 or they may be other active devices or they may be passive devices (e.g. decoupling capacitors) which may by advantageously placed in close proximity to one or more contact elements on the integrated circuit 505. This allows the capacitance of the decoupling capacitor to be small and yet achieve an adequate decoupling effect. The electrical devices may be mounted on the flexible wiring layer 507 within the chamber 519, such as the devices 605 and 607, or they may be mounted outside of the chamber 519 as in the case of device 609. By mounting devices such as devices 605 and 607 within the chamber 519 on the side 611 of the flexible wiring layer 507, these devices within the chamber may be cooled by the fluid which is introduced into the chamber 519. It is a desirable feature to make a short length electrical contact through the flexible wiring layer. In the implementation shown in FIG. 6A, the flexible wiring layer should be capable of holding the pressurized fluid without leaking. This can be achieved by using filled vias or by inserting a continuous membrane such as silicone across the pressure plenum. In a preferred embodiment, a silicone membrane having a thickness of about 0.015 inches (380 microns) was used.

The assembly 601 shown in FIG. 6A also includes one or more cavities in which a fluid such as a gas or a liquid is allowed to flow through. These cavities 603 may be used to cool or alternatively heat the integrated circuit 505 during testing or burn-in of the integrated circuit 505. A cavity 603 may run the entire length or only a portion of the entire length of the backing plate 503.

It is generally desirable that the flexible wiring layer 507 be a thin layer so as to provide an acceptable thermal conductance between the fluid within the chamber 519 and the integrated circuit 505. For example, where an extensive semiconductor wafer testing is to take place and the self-heating of the wafer is undesirable, a cooled fluid may be used within the chamber 519 to keep the integrated circuit 505 at a desired temperature. At the same time, a coolant may be circulated through the channels 603. Alternatively, where a stress test is to be performed on the integrated circuit 505 in conjunction with the electrical testing, a heated fluid may be introduced into the chamber 519 and/or into the channel 603. The temperature of the fluid within the chamber 519 may be controlled as well as the temperature of the fluid within the channel 603 in order to achieve a desired temperature for the testing procedures of the integrated circuit 505.

It will be appreciated that the flexible wiring layer 507 may act as a conventional probe card in redistributing and interconnecting the contact elements on the integrated circuit to a test device such as an automatic test equipment (ATE). Thus, the flexible wiring layer 507 may provide for contact pitch transformation with its wiring layers. These wiring layers serve to interconnect the contacts on the integrated circuit with the ATE device and with the various circuits mounted on the surface 611 of the flexible wiring layer 507, such as the devices 605 and 607. Typically, the flexible wiring layer 507 will include a bus which delivers signals to and from the ATE, such, as the bus 610 shown in FIG. 6A.

FIG. 6B shows another alternative embodiment of the present invention in which the assembly 631 includes a flexible wiring layer 633 which in this case includes stop structures, such as the stop structure 641, and includes resilient contact elements such as the resilient contact element 639. Thus, unlike the assembly 610 shown in FIG. 6A, the flexible wiring layer includes both stop structures and resilient contact elements which may be used to make contact with contact elements on an integrated circuit 635, such as the contact element 637. In all other respects, the assembly of FIG. 6B resembles the assembly of FIG. 5. It will be appreciated that the assembly of FIG. 6B may be used to test or burn-in semiconductor wafers which do not include resilient contact elements but rather include merely bonding pads or other contact elements (e.g. C4 balls) located on the surface of the semiconductor wafer.

An alternative embodiment of an assembly of the present invention may use a vacuum generated between the integrated circuit 505 and the flexible wiring layer 507 in order to create a pressure differential between one side and the other side of the flexible wiring layer 507. For example, if a vacuum port is located in the backing plate 503, and this port is coupled to a vacuum pump, a vacuum may be drawn in the chamber created by the rigid backing plate 503 and the flexible wiring layer 507. If normal air pressure is maintained in the chamber 519, when the vacuum is drawn, the flexible wiring layer 507 will be pressed toward the integrated circuit 505, causing contact to be made between the corresponding contact terminals on the flexible wiring layer 507 and the integrated circuit 505.

Figure 7A:
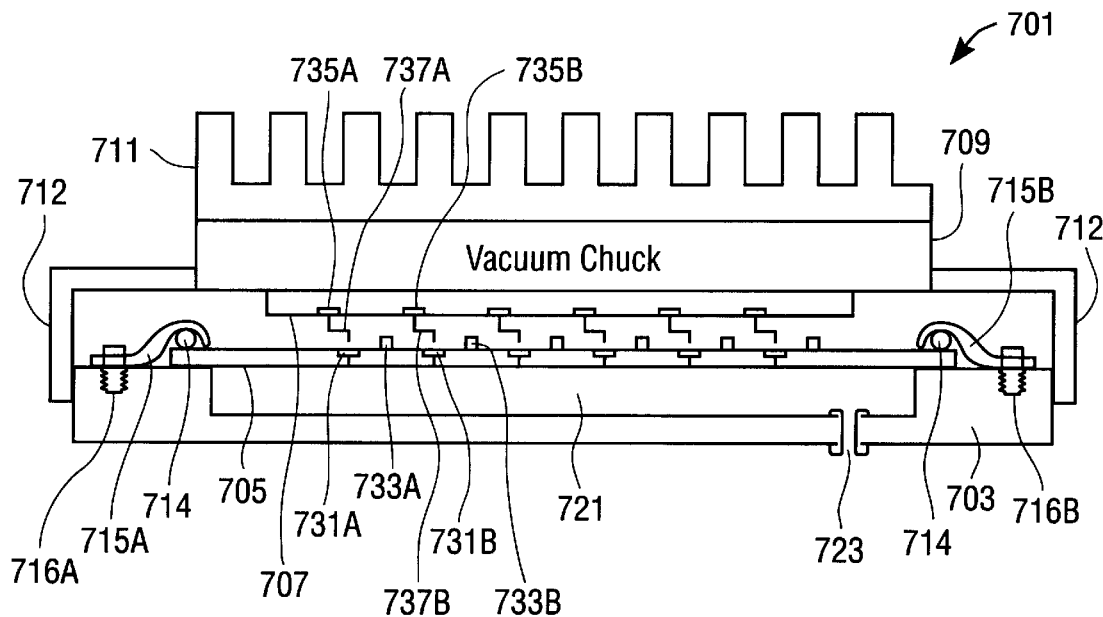
FIG. 7A shows another embodiment of the present invention of an electrical interconnection assembly.
Figure 7B:
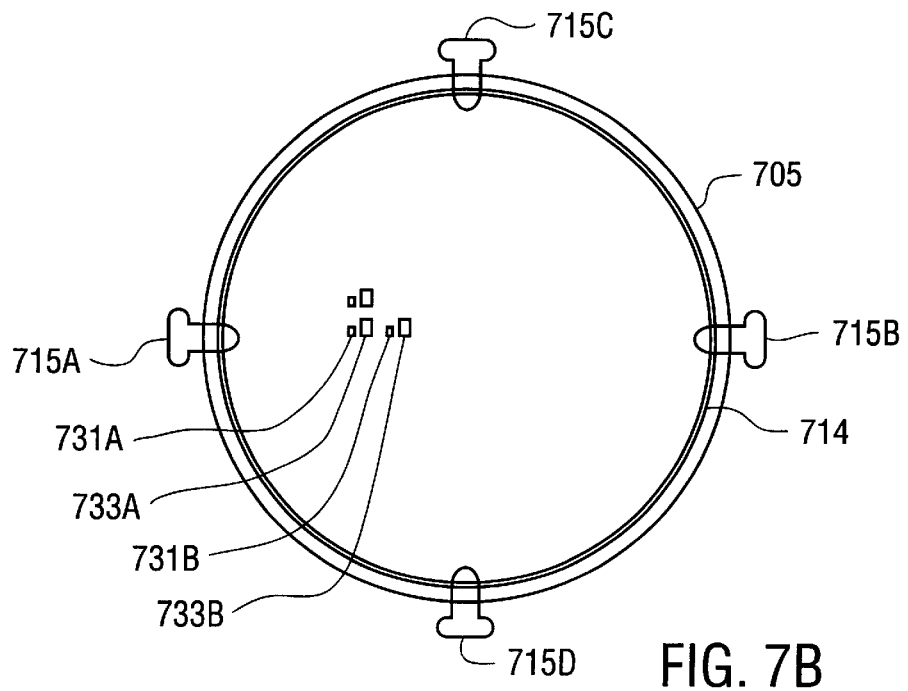
FIG. 7B shows a top view of the flexible wiring layer 705 shown in FIG. 7A.

FIGS. 7A and 7B show another embodiment of an interconnection assembly which utilizes a flexible wiring layer according to the present invention. The assembly 701 shown in FIG. 7A includes a plenum which includes at least one fluid port 723. While FIG. 7A shows port 723 on the bottom of the assembly, it will be appreciated that the port 723 may be located on the side of the assembly so that the bottom is flat and portless. The fluid port 723 provides fluid into the chamber 721 in order to deform the flexible wiring layer 705 and press it towards the device under test such as the integrated circuit 707. The integrated circuit 707 is drawn to a vacuum chuck 709 using conventional techniques associated with vacuum chucks which are known in the art. The vacuum chuck may be used to control the wafer temperature by using techniques which are well-known in the art. In FIG. 7A, an air cooled vacuum chuck is shown. The vacuum chuck 709 includes a heat sink 711 which is mounted on the upper surface of the vacuum chuck 709. The vacuum chuck 709 is coupled by flanges 712 to the plenum 703 as shown in FIG. 7A. In one embodiment, the vacuum chuck 709 and the heat sink 711 may be made from aluminum and the flanges 712 and the plenum 713 may be formed from titanium. In the example of FIG. 7A, the integrated circuit 707 includes resilient contact elements, such as the contact elements 737A and 737B, each of which are attached to contact elements 735A and 735B which may be bonding pads on the integrated circuit 707.

It will be appreciated that reference being made to an integrated circuit 707 is one example of various devices under test. Rather than a single integrated circuit, the device under test shown in FIG. 7A may be a complete semiconductor wafer having many integrated circuits or a portion of such a wafer or may be a packaged integrated circuit or may be a passive interconnection substrate such as an interposer for a probe card or a wiring substrate. Thus, it will be appreciated that when reference is made to an integrated circuit in the various embodiments of the invention, that this reference is solely for the purpose of convenience and that any of these alternative devices under test may be utilized in the assemblies of the present invention.

As shown in FIG. 7A, the flexible wiring layer 705 includes stop structures 733A and 733B and includes the contact elements 731A and 731B. It will also be appreciated that the flexible wiring layer includes the various conductive traces along its surface or within its structure and includes an interconnection bus to an ATE or to another type of testing device.

The flexible wiring layer 705 is held in place within the assembly 701 by an O-ring seal 714 which is clamped at the periphery of the flexible wiring layer 705 as shown in the top view of FIG. 7B. The clamps 715A and 715B, as shown in the cross-sectional view of FIG. 7A, secure the O-ring to the edge of the layer 705 and these clamps are secured into the plenum 703 by bolts 716A and 716B. In an alternative embodiment, the O-ring seal 714 may be sandwiched between the flexible wiring layer 705 and the plenum 703. The clamps 715A and 715B would be straight, rather than curved, or have an "L" shape and would secure the layer 705 tightly to the O-ring seal 714.

The operation of the assembly 701 will now be described. Typically, the device under test, such as an integrated circuit or a complete semiconductor wafer, is placed against the vacuum chuck such that the contact elements face away from the vacuum chuck. The device under test is drawn toward the chuck by creating a vacuum within the interior of the chuck as is known in the art. Holes in the surface of the chuck draw the wafer or other device under test securely to the surface of the chuck. Then the contact elements on the device under test are aligned in x and in y and in θ relative to the contact elements on the flexible wiring layer 705 in order to allow proper contact to be made between corresponding contact elements on the layer 705 and the device under test 707. At this point, the z spacing between the device under test 707 and the flexible wiring layer 705 may be decreased so that the two surfaces are in close proximity. Next, the chamber 721 is filled with a fluid in order to "inflate" the layer 705 such that it is pressed towards the device under test 707 causing contact to be made between corresponding contact elements between the two surfaces.

Figure 8:
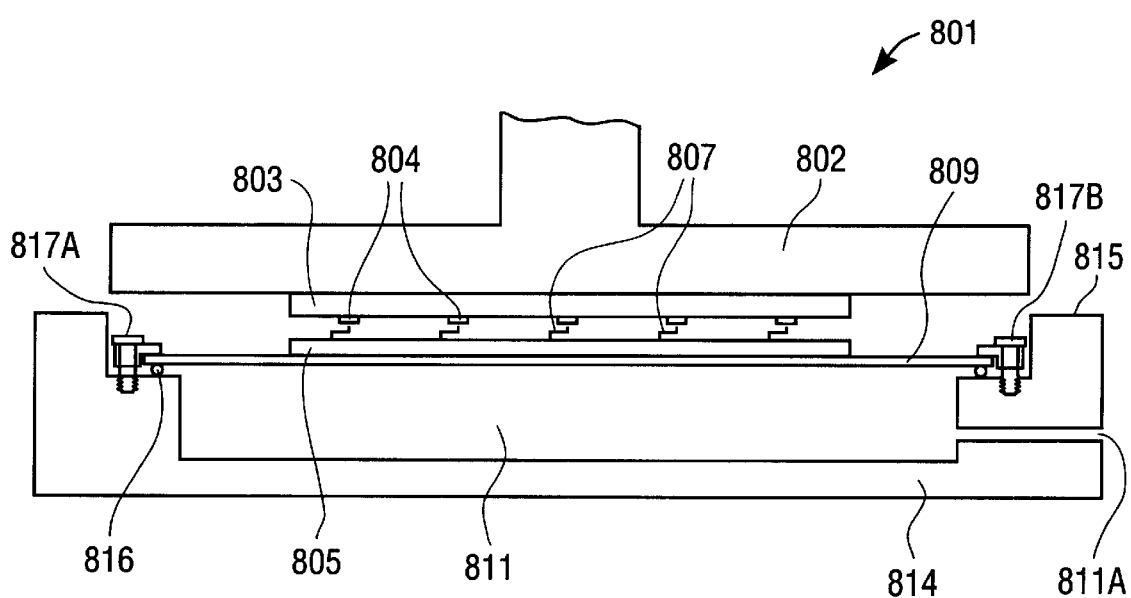
FIG. 8 shows a partial view of another example of the present invention.

FIG. 8 shows another example of the invention. In this example, a device under test 805 is attached to a flexible layer 809 which is held in the assembly 801. The clamps 817A and 817B secure the flexible layer 809 to the O-ring seal 816, thereby providing a seal for the fluid, receiving chamber 811, which is formed-by the base 814 and the layer 809 Fluid (e.g a liquid or pressurized air) may be introduced into the chamber 811 through the port 811A. The fluid, when introduced, will push the layer 809 so that the device under test 805 (which may be a semiconductor wafer having resilient contact elements 807) is pushed toward the wiring layer 803, which is similar to the flexible wiring layer 507 except that layer 803 need not be flexible/deformable. When the device under test 805 is pushed sufficiently toward the layer 803, the resilient contact elements 805 make electrical contact with corresponding contact elements (e.g. contact pads 804) on the layer 803. The layer 803 is attached to a chuck 802 which itself is secured to the flange 815. In an alternative embodiment, the resilient contact elements may be attached to layer 803 and may make contact to contact pads on the device under test 805. In other embodiments, different contact elements (e.g. balls) may be used on one or both of the surfaces.

It will be appreciated that the interconnection assembly of the present invention may be utilized for semiconductor probing, such as probing of complete semiconductor wafers, or in the burn-in of singulated integrated circuits or the burn-in of complete semiconductor wafers. In the case of probing, the assembly may be mounted in the test head and aligned in x, y, and z and θ relative to either known positions on the semiconductor wafer or known positions on a probing device such as a wafer prober which are known relative to known positions on a semiconductor wafer. Then the flexible wiring layer may be brought into close proximity with the semiconductor wafer and then inflated in order to cause electrical contact. In the case of a burn-in operation, the device under test may be mounted in the assembly and aligned with the contacts on the flexible wiring layer and then moved to a burn-in environment and connected to test equipment and then the flexible wiring layer is "inflated" or otherwise drawn towards the device under test in order to make electrical contact.

In the foregoing specification, the invention has been described with reference to specific exemplary embodiments thereof. It will, however, be evident that various modifications and changes can be made thereto without departing from the broader spirit and scope of the invention as set forth in the appended claims. The specification and drawings are accordingly to be regarded in an illustrative sense rather than in a restrictive sense.

What is claimed is:

1. An interconnect assembly comprising:
   a flexible substrate including a plurality of first electrical contacts,
   a semiconductor device disposed in proximity to said flexible substrate and having a plurality of second electrical contacts,
   a fluid chamber, and
   a pump in fluid communication with said fluid chamber, wherein circulation of a fluid through said fluid chamber causes said flexible substrate to press towards said semiconductor device, ones of said plurality of first electrical contacts electrically engaging ones of said plurality of second electrical contacts,
   wherein one of said plurality of first electrical contacts and said plurality of second electrical contacts is compliant.

2. The interconnect assembly of claim 1, wherein said fluid chamber includes at least one inlet port.

3. The interconnect assembly of claim 1, wherein said fluid chamber includes at least one outlet port.

4. The interconnect assembly of claim 1, wherein said fluid is one of a gas and a liquid.

5. The interconnect assembly of claim 1, wherein said semiconductor device comprises an integrated circuit.

6. The interconnect assembly of claim 1, wherein said semiconductor device comprises a semiconductor wafer containing a plurality of integrated circuits.

7. The interconnect assembly of claim 1 further comprising a temperature control device for controlling a temperature of said fluid.

8. The interconnect assembly of claim 7, wherein said temperature control device is capable of heating said fluid.

9. The interconnect assembly of claim 7, wherein said temperature control device is capable of cooling said fluid.

10. The interconnect assembly of claim 7, wherein said temperature control device is capable of maintaining said fluid at a selected temperature.

11. The interconnect assembly of claim 1, wherein at least one of said plurality of first electrical contacts comprises an elongate contact element.

12. The interconnect assembly of claim 1, wherein at least one of said plurality of second electrical contacts comprises an elongate contact element.

13. The interconnect assembly of claim 1 further comprising at least one stop structure disposed on said semiconductor device defining a minimum separation of said flexible substrate from said semiconductor device.

14. The interconnect assembly of claim 1 further comprising at least one stop structure disposed on said flexible substrate defining a minimum separation of said flexible substrate from said semiconductor device.

15. The interconnect assembly of claim 1, wherein said flexible substrate is in electrical contact with semiconductor test equipment.

16. The interconnect assembly of claim 1, wherein said flexible substrate comprises at least one wiring layer.

17. The interconnect assembly of claim 1 further comprising at least one electrical device disposed on said flexible substrate.

18. The interconnect assembly of claim 17, wherein said electrical device comprises an integrated circuit.

19. The interconnect assembly of claim 17, wherein said electrical device comprises a test circuit.

20. The interconnect assembly of claim 1 further including at least one cavity disposed adjacent said semiconductor device.

21. The interconnect assembly of claim 20, wherein said at least one cavity contains a fluid for affecting a temperature of said semiconductor device.

22. The interconnect assembly of claim 1 further comprising a vacuum chamber, said flexible substrate composing a portion of said vacuum chamber.

23. An interconnect assembly comprising:
a semiconductor device,
flexible substrate means for providing electrical connections between a semiconductor tester and said semiconductor device, said flexible substrate means disposed in proximity to said semiconductor device, and
circulating means for circulating a fluid through a fluid chamber causing said flexible substrate to press towards said semiconductor device such that compliant contacts on one of said semiconductor device and said flexible substrate means form electrical connections with contacts on the other of said semiconductor device and said flexible substrate means.

24. The interconnect assembly of claim 23, wherein said fluid is one of a gas and a liquid.

25. The interconnect assembly of claim 23 further comprising temperature control means for controlling a temperature of said fluid.

26. The interconnect assembly of claim 23, wherein said flexible substrate means comprises a plurality of electrical contacts at least one of which comprises an elongate contact element.

27. The interconnect assembly of claim 23, wherein said semiconductor device comprises a plurality of electrical contacts at least one of which comprises an elongate contact element.

28. The interconnect assembly of claim 23 further comprising stop structure means for defining a minimum separation between said flexible substrate means and said semiconductor device.

29. The interconnect assembly of claim 23 further comprising at least one electrical device disposed on said flexible substrate means.

30. The interconnect assembly of claim 23 further comprising fluid cavity means for containing a second fluid, said fluid cavity means disposed adjacent said semiconductor device.

31. The interconnect assembly of claim 30, wherein said fluid cavity means further affects a temperature of said semiconductor device.

32. The interconnect assembly of claim 23 further comprising vacuum means for drawing said flexible substrate means towards said semiconductor device.

33. A method of making electrical connections between a flexible substrate comprising a plurality of first electrical contacts and a semiconductor device comprising a plurality of second electrical contacts, said method comprising:
positioning said flexible substrate in proximity to said semiconductor device such that ones of said plurality of first electrical contacts are disposed in proximity to corresponding ones of said second electrical contacts, and
circulating a fluid through a chamber, causing said flexible substrate to press towards said semiconductor device, said ones of said plurality of first electrical contacts making electrical contact with said ones of said second electrical contacts,
wherein one of said plurality of first electrical contacts and said plurality of second electrical contacts is compliant.

34. The method of claim 33, wherein said fluid is one of a gas and a liquid.

35. The method of claim 33 further comprising controlling a temperature of said fluid.

36. The method of claim 35, wherein said temperature controlling step further comprises heating said fluid.

37. The method of claim 35, wherein said temperature controlling step further comprises cooling said fluid.

38. The method of claim 35, wherein said temperature controlling step further comprises maintaining said fluid at a predetermined temperature.

39. The method of claim 33, wherein at least one of said plurality of first electrical contacts comprises an elongate contact element.

40. The method of claim 33, wherein at least one of said plurality of second electrical contacts comprises an elongate contact element.

41. The method of claim 33 further comprising stopping movement of said flexible substrate towards said semiconductor device at a predetermined minimum separation between said flexible substrate and said semiconductor device.

42. The method of claim 33 further comprising receiving test data for said semiconductor device from a semiconductor tester.

43. The method of claim 33 further comprising sending response signals generated by said semiconductor device to a semiconductor tester.

44. The method of claim 33, wherein said flexible substrate comprises at least one wiring layer.

45. The method of claim 33 further comprising disposing at least one electrical device on said flexible substrate.

46. The method of claim 33 further including providing a second fluid in at least one cavity disposed adjacent said semiconductor device.

47. The method of claim 46, wherein said second fluid affects a temperature of said semiconductor device.

48. The method of claim 33 further comprising creating a vacuum causing said flexible substrate to move towards said semiconductor device.

* * * * *